United States Patent
Sullivan et al.

(10) Patent No.: US 9,025,919 B2
(45) Date of Patent: May 5, 2015

(54) HIGH VOLTAGE PHOTO-SWITCH PACKAGE MODULE HAVING ENCAPSULATION WITH PROFILED METALLIZED CONCAVITIES

(71) Applicant: Lawrence Livermore National Security, LLC, Livermore, CA (US)

(72) Inventors: James S. Sullivan, Livermore, CA (US); David M. Sanders, Livermore, CA (US); Steven A. Hawkins, Livermore, CA (US); Stephen A. Sampayan, Manteca, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 425 days.

(21) Appl. No.: 13/657,746

(22) Filed: Oct. 22, 2012

(65) Prior Publication Data

US 2013/0056842 A1    Mar. 7, 2013

Related U.S. Application Data

(63) Continuation-in-part of application No. 13/171,372, filed on Jun. 28, 2011, now Pat. No. 8,655,125.

(60) Provisional application No. 61/549,603, filed on Oct. 20, 2011, provisional application No. 61/358,994, filed on Jun. 28, 2010.

(51) Int. Cl.
| | |
|---|---|
| *G02B 6/26* | (2006.01) |
| *G02B 6/42* | (2006.01) |
| *H01L 31/0203* | (2014.01) |
| *G02F 1/01* | (2006.01) |
| *G02F 1/015* | (2006.01) |
| *H03K 17/78* | (2006.01) |

(52) U.S. Cl.
CPC ............ *H01L 31/0203* (2013.01); *H03K 17/78* (2013.01); *G02F 1/0102* (2013.01); *G02F 1/015* (2013.01); *G02F 2201/02* (2013.01); *G02F 2201/50* (2013.01); *G02F 2202/10* (2013.01)

(58) Field of Classification Search
USPC .......................... 250/208.4, 214 SW; 385/40
See application file for complete search history.

(56) References Cited

U.S. PATENT DOCUMENTS 3,952,265 A * 4/1976 Hunsperger ............... 372/50.21
4,240,088 A * 12/1980 Myers .......................... 327/514
(Continued)

FOREIGN PATENT DOCUMENTS

| | | |
|---|---|---|
| JP | 06-003692 A | 1/1994 |
| JP | 2001-066628 A | 3/2001 |

*Primary Examiner* — Uyen Chau N Le
*Assistant Examiner* — Chad Smith
(74) *Attorney, Agent, or Firm* — James S. Tak (57) ABSTRACT

A photo-conductive switch package module having a photo-conductive substrate or wafer with opposing electrode-interface surfaces metalized with first metallic layers formed thereon, and encapsulated with a dielectric encapsulation material such as for example epoxy. The first metallic layers are exposed through the encapsulation via encapsulation concavities which have a known contour profile, such as a Rogowski edge profile. Second metallic layers are then formed to line the concavities and come in contact with the first metal layer, to form profiled and metalized encapsulation concavities which mitigate enhancement points at the edges of electrodes matingly seated in the concavities. One or more optical waveguides may also be bonded to the substrate for coupling light into the photo-conductive wafer, with the encapsulation also encapsulating the waveguides.

6 Claims, 13 Drawing Sheets

(56) References Cited

U.S. PATENT DOCUMENTS

| | | | |
|---|---|---|---|
| H695 H * | 10/1989 | Weiner et al. | 257/21 |
| 5,047,623 A * | 9/1991 | Wilcox | 250/214.1 |
| 5,541,751 A | 7/1996 | Sumida et al. | |
| 6,411,746 B1 * | 6/2002 | Chamberlain et al. | 385/2 |
| 6,483,094 B1 * | 11/2002 | Yahav et al. | 250/214 R |
| 2005/0196093 A1 | 9/2005 | Grossman et al. | |
| 2007/0092812 A1 * | 4/2007 | Caporaso et al. | 430/57.7 |

\* cited by examiner

HIGH VOLTAGE PHOTO-SWITCH PACKAGE MODULE HAVING ENCAPSULATION WITH PROFILED METALLIZED CONCAVITIES

II. CROSS-REFERENCE TO RELATED APPLICATIONS

This application claims the benefit of U.S. Provisional Application No. 61/549,603, filed Oct. 20, 2011 and is a continuation-in-part of U.S. application Ser. No. 13/171,372, filed Jun. 28, 2011, which claims the benefit of U.S. Provisional Application No. 61/358,994, filed Jun. 28, 2010, all of which are incorporated by reference herein.

I. FEDERALLY SPONSORED RESEARCH OR DEVELOPMENT

The United States Government has rights in this invention pursuant to Contract No. DE-AC52-07NA27344 between the United States Department of Energy and Lawrence Livermore National Security, LLC for the operation of Lawrence Livermore National Laboratory.

I. FIELD OF THE INVENTION

The present invention relates to photoconductive switches, and more particularly to a high voltage photo-conductive switch package module having one or more optical waveguides bonded to a photo-conductive wafer (such as SiC or GaN) and encapsulated with a high dielectric strength material, to manage and enable operation in high electric field regions.

II. BACKGROUND OF THE INVENTION

Photo-switches (or photo-conductive switches) are known by which light input triggers activation of the switch to conduct current therethrough under an electric potential thereacross. However, coupling light into the switch while mitigating electric field issues remains problematic. Additionally for repetitive pulse applications, thermal management must also be considered. One example known method employs a fused silica waveguide coupled through an oil-filled gap to a silicon carbide wafer. However, this approach is limited by the dielectric field strength of insulating oil especially in very high electric field regions problems with electric field management at the interface.

For high voltage applications producing high electric field regions, there is a need for a photo-conductive switch package capable of coupling light into the photo-conductive material while mitigating electric field issues in high voltage applications, such as bulk failure of photo-switch material or surface flashover at the edges of the switch.

III. SUMMARY OF THE INVENTION

One aspect of the present invention includes a photoconductive switch package module comprising: a photo-conductive wafer having opposing electrode-interface surfaces, and a light-input surface; first metallic layers formed on said electrode-interface surfaces; an optical waveguide having input and output ends with the output end bonded to the light-input surface of the photo-conductive wafer to form a waveguide-wafer interface for coupling light into said photo-conductive wafer; a dielectric encapsulation surrounding the photo-conductive wafer and optical waveguide so that only the metallic layers and the input end of the optical waveguide are exposed; and second metallic layers formed on said first metallic layers so that the waveguide-wafer interface is positioned under the second metallic layers.

Another aspect of the present invention includes a photo-conductive switch package module comprising: a photo-conductive substrate having opposing electrode-interface surfaces; first metal layers formed on said electrode-interface surfaces; a dielectric encapsulation surrounding the photo-conductive substrate and having concavities on opposite sides of the encapsulation, wherein the concavities are bounded in part by the first metal layers; and second metal layers lining the concavities and in contact with the first metal layers.

Another aspect of the present invention includes a method of fabricating a photo-conductive switch package module comprising: providing a photo-conductive substrate having opposing electrode-interface surfaces; forming first metal layers on said electrode-interface surfaces; encapsulating the photo-conductive substrate with a dielectric encapsulation having concavities on opposite sides thereof which expose the first metal layers from within the concavities; and forming second metal layers to line the concavities and come in contact with the first metal layers.

Generally, the present invention generally pertains to a photo-conductive switch package module capable of operating in high voltage and high average power applications, e.g. as a closing switch in compact stacked pulse-forming lines, dielectric wall accelerators, and power conditioning applications for directed energy. The module includes at its core a photo-conductive wafer or substrate, which is preferably a wide band-gap material such as for example silicon carbine (SiC) or gallium nitride (GaN). The photoconductive wafer has two electrode-interfacing surfaces (typically on opposite sides), and one or more light-input surfaces.

A first metal layer is formed on each of the two electrode-interfacing surfaces of the photo-conductive substrate, and preferably the substrate is then high-temperature annealed. This annealed first metal layer provides an electrical connection to the photo-switch material. Preferably, the area of the first metal layer is smaller than the electrode-interface surfacing surface of the substrate so that an edge margin exists around this annealed first metal layer.

One or more optical waveguides are then bonded to the light-input surfaces to couple light from a light source into the photo-conductive material. The waveguide material may be, for example, fused silica, $Al_2O_3$, un-doped SiC, or other optically transparent and preferably thermally conductive material, so that it may simultaneously couple light into the material while mitigating surface flashover issues at the edges of the switch and simultaneously conducting heat away from the switch. And bonding methods may include, for example, bonding with optically transparent compounds (i.e. silicone or resin-based compounds), chemically bonding, such as by hydroxyl or silicate bonding, adhesive-free bonding (i.e. Van der Waals bonds), or fusion bonding, such as via Frit or molten glass. Processes for fusion bonding may include electrical discharge and/or laser brazing/welding. Optical fibers may then be bonded to the opposite ends of the waveguide (i.e. the light-input ends of the waveguide) using similar bonding methods. It is notable that optical fibers (fiber optics) are also considered a type of waveguide as they are also transport light. Therefore optical fibers may alternatively be coupled/bonded directly to the photo-conductive substrate with the same of similar bonding methods as those used for other optical waveguides. Also, the wide band-gap photo-switch material may be precision machined (i.e. "lapped" or other process) into optically transparent material such as fused silica, Al2O3, or un-doped SiC.

The assembly comprising the metalized substrate and waveguides are then encapsulated with a high dielectric strength material, such as epoxy or other dielectric material to mange electric fields. The encapsulation covers all parts of the package with only the metal layers and the light-input ends of the waveguides exposed.

A conductive layer (i.e. second metal layer) is then formed over the exposed first metal layers such that the edges of the conductive layer extend over the bonded interface between the waveguide and the substrate, and the waveguide-substrate interface is posited under the conductive layer. The electric field may be graded at enhancement points along the edges of the conductive layer by forming an electrically resistive layer on the surface of the encapsulation to surround the conductive layer.

Furthermore, optical losses may be minimized by optionally bonding the waveguide to the photo-switch substrate at an optimum angle (e.g. Brewster's angle). In addition, cladding or other optical coating may be applied to the waveguide to reduce losses at the interface to materials of different dielectric coefficient including the surrounding epoxy.

In an example embodiment, the encapsulation has profiled and metallized concavities on opposite sides of the encapsulation, which are shaped to receive and come in contact with other electrodes having similarly profiled convex mating surfaces. The contoured concavities operate to mitigate and reduce the overall maximum (peak) electric fields occurring at enhancement points at the edges of the electrode adjacent the photo-conductive substrate (which are wide bandgap semiconductor substrates (wafers) used to fabricate high voltage photo-conductive switches. In this manner, the maximum electric field may be designed to occur near the center of the device well away from the electrode edge, and thereby enables such switches to operate at higher average electric fields.

IV. BRIEF DESCRIPTION OF THE DRAWINGS

The accompanying drawings, which are incorporated into and form a part of the disclosure, are as follows.

V. DETAILED DESCRIPTION

Figure 7:
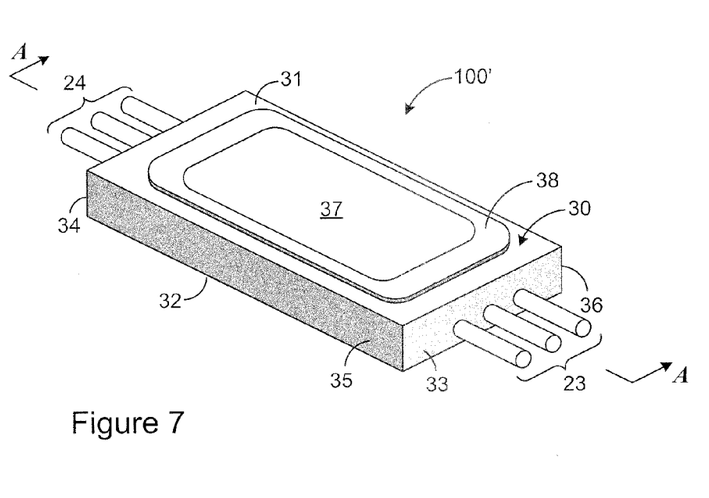
Figure 8:
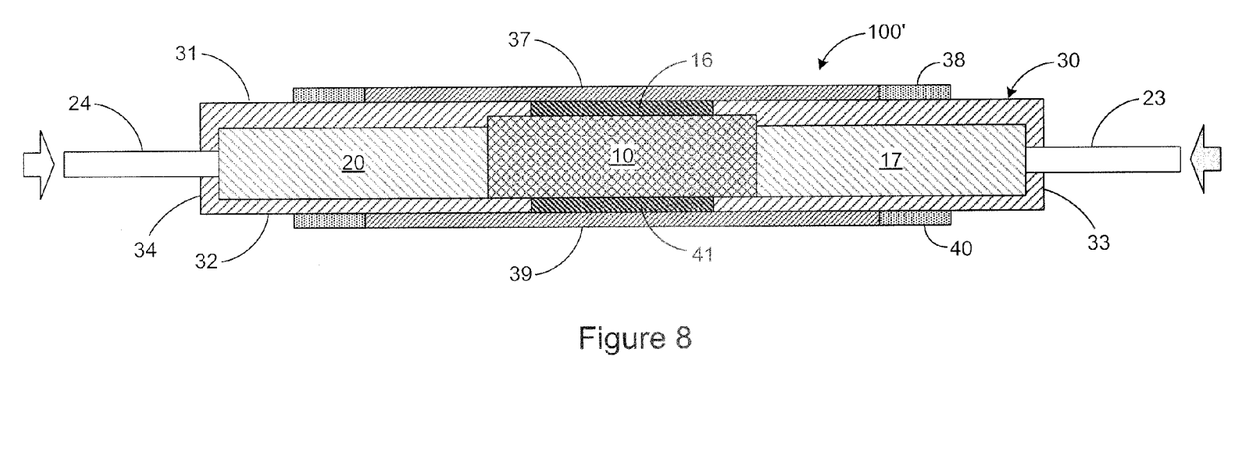

Turning now to the drawings, FIGS. 1-8 show various views and at various fabrication stages of a first exemplary embodiment of the photo-conductive switch of the present invention (100 in FIGS. 7 and 8) having two waveguides and corresponding waveguide-substrate interfaces. Starting with FIG. 1, a photo-conductive substrate 10 is shown having a top surface 11, a bottom surface 12 and side surfaces 13-16. The top and bottom surfaces 11, 12 are the electrode-interfacing surfaces, as can be seen by the first metal layer 16 formed on the top surface 11, and side surfaces 13 and 14 are the light-input surfaces. As shown in FIG. 8, another first metal layer 41 is formed on the bottom surface 12. It is notable that while the metal layers 16 and 41 are shown as having a circular configuration, other geometries may be used as well. These metal layers are preferably annealed at this stage.

Figure 1:
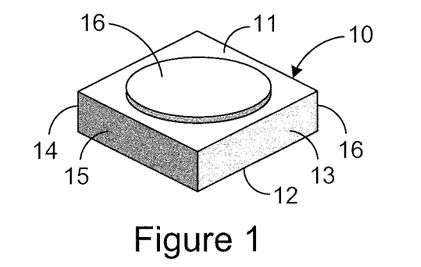
FIGS. 1-8 show various views and at various fabrication stages of a first exemplary embodiment of the photo-conductive switch of the present invention having two waveguides and corresponding waveguide-substrate interfaces.
Figure 2:
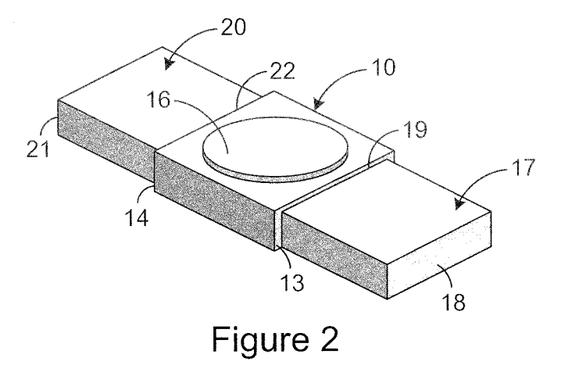

FIG. 2 shows two waveguides 17 and 20 bonded to the substrate 10. In particular, surface 19 of the waveguide 17 is bonded to the light-input surface 13 of the substrate, and surface 22 of the waveguide 20 is bonded to the light-input surface 14 of the substrate. As previously discussed, various bonding methods may be employed to produce preferably a structurally rigid bond.

Figure 3:
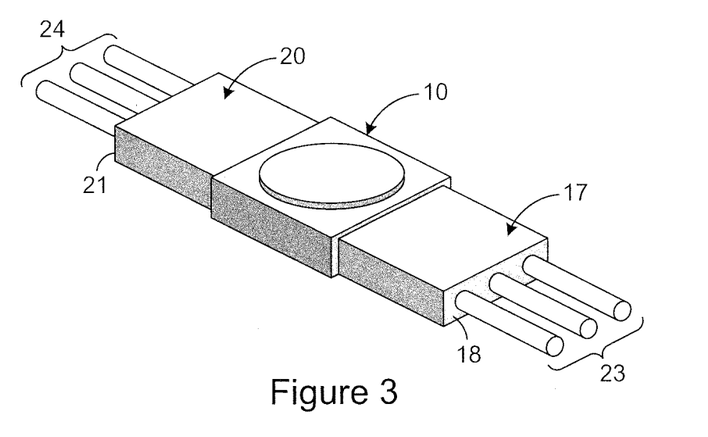

FIG. 3 shows two sets of optical fibers 23 and 24 bonded to the light-input surfaces 17 and 21 of the waveguides 17 and 20, respectively. While three are shown, it is appreciated that any number of fiber optics may be employed to deliver the proper level of light to the substrate. Furthermore, in one example embodiment, the optical fibers coming in on one side of the substrate may be offset or staggered with respect to optical fibers coming in on the opposite side of the substrate for better light dispersion in the substrate.

Figure 4:
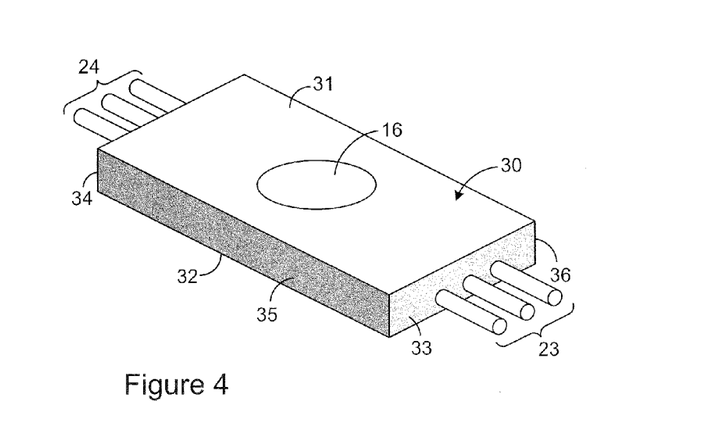

FIG. 4 shows an encapsulation structure 30 formed around the assembly of FIG. 3. The structure 30 has a top surface 31, a bottom surface 32, and side surfaces 33-36. As shown the optical fibers 23, 24 extend out from side surfaces 33 and 34. And the first metal layers 16 and 41 remain exposed. Generally, the dielectric encapsulation is a structure made of a dielectric material which encapsulates the assembly in general and the photo-conductive substrate in particular.

Figures 5, 6:
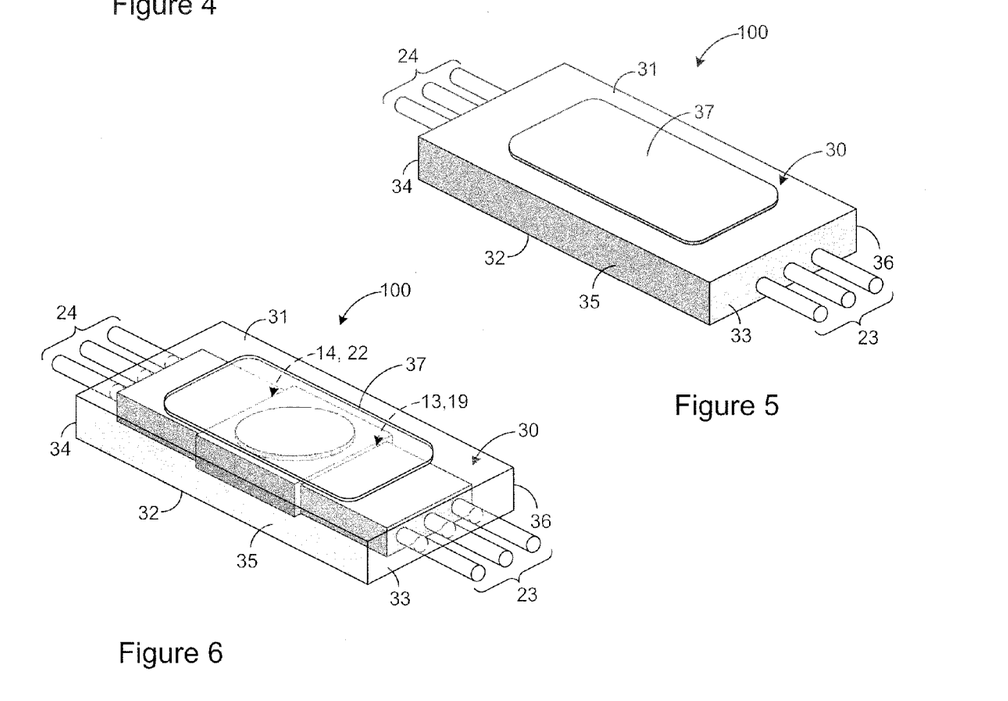

FIG. 5 next shows a conductive layer, i.e. a second metal layer, 37 formed over the exposed first metal layers 16 and 41 and a portion of the top surface 31 of the encapsulation structure. And as shown in the partially transparent view of FIG. 6, the conductive layer 37 extends beyond the waveguide-substrate interface indicated at 14,22 and 13, 19. Another second metal layer is formed as shown on the bottom surface 32 of the encapsulation structure, as shown in FIG. 8. FIGS. 5 and 6 show the completed first embodiment, indicated at reference character 100.

FIG. 7 shows an optional resistive layer 38 formed on the top surface 31 of the encapsulation structure and surrounding the second metal layer 37 to form a second embodiment 100' of the photo-conductive switch package module. Though not shown in FIG. 7, the same is true for the second metal layer 39 shown in FIG. 8. And FIG. 8 shows the cross-section view of the second embodiment 100'.

Figure 9:
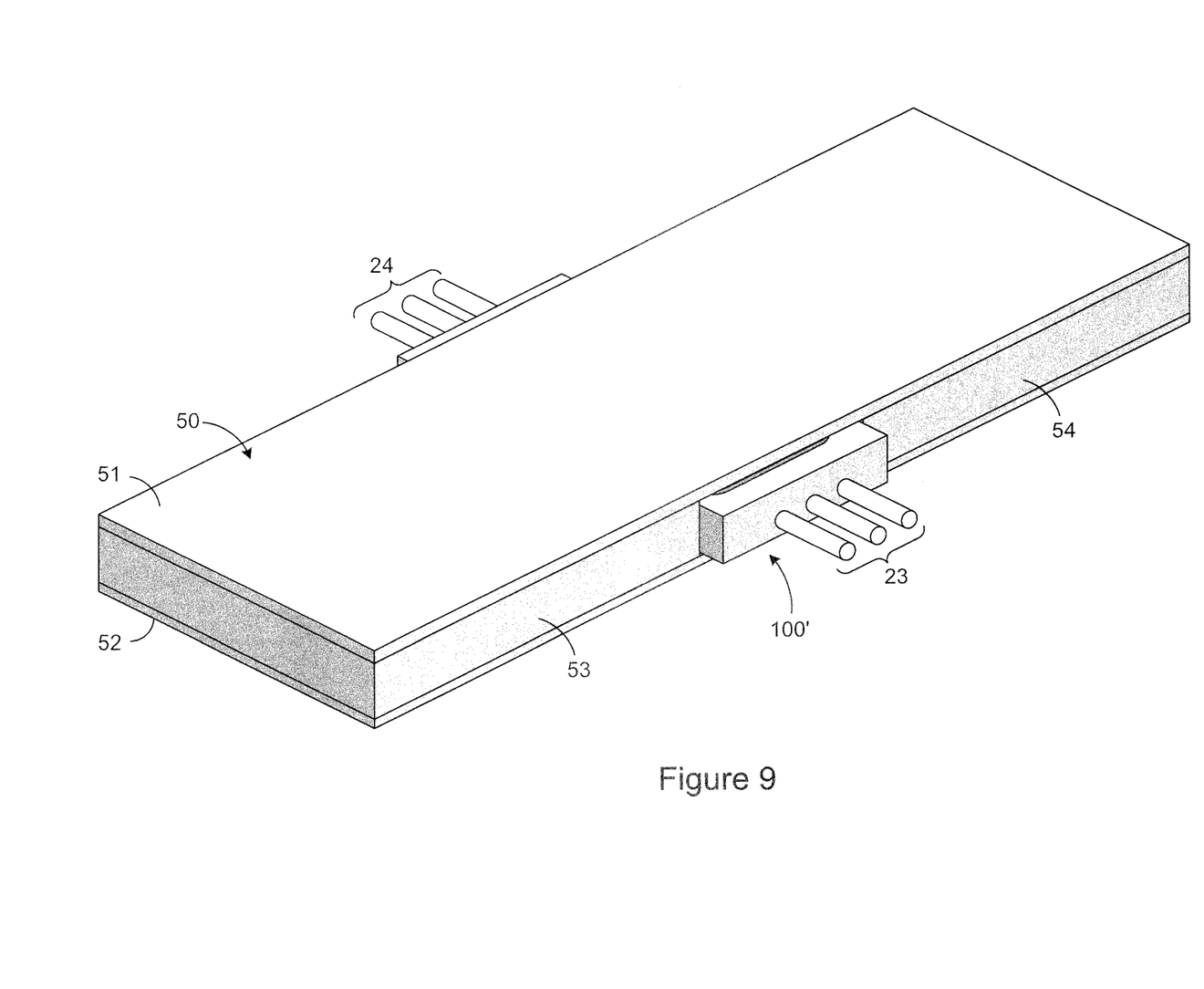
FIG. 9 shows the first exemplary embodiment used in a pulse-forming line application.
Figure 10:
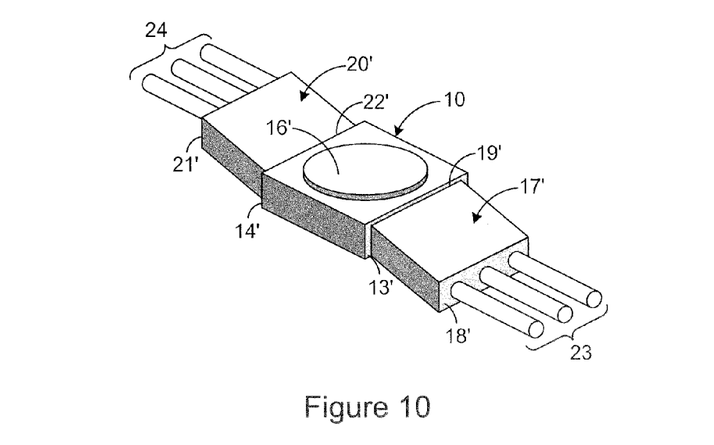
FIGS. 10-13 show various views and at various fabrication stages of a second exemplary embodiment of the photo-conductive switch of the present invention, with the waveguides connected to the switch wafer at an optimal Brewster's angle.
Figure 11:
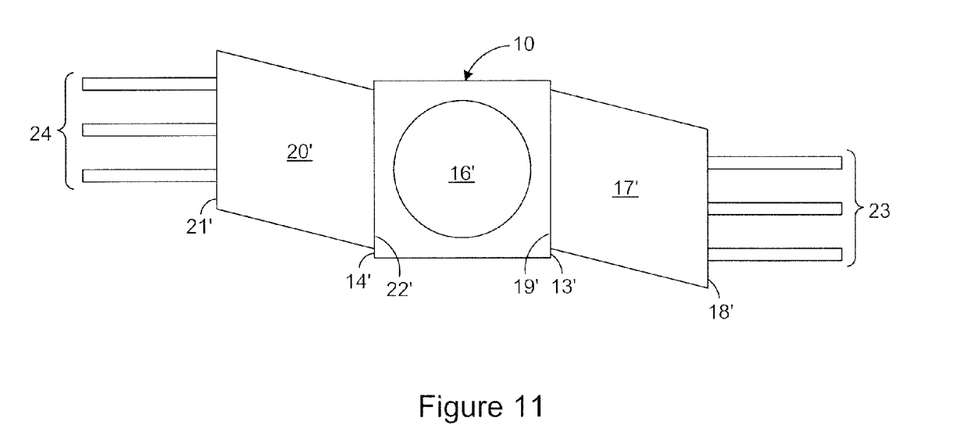

FIG. 9 shows the second exemplary embodiment 100' used in a pulse-forming line application. In particular, the module 100' is sandwiched between two conductor plates 51 and 52 which are in contact with the second metal layers. Additionally two insulators 53 and 54 are also shown providing support between the conductor plates.

Figure 12:
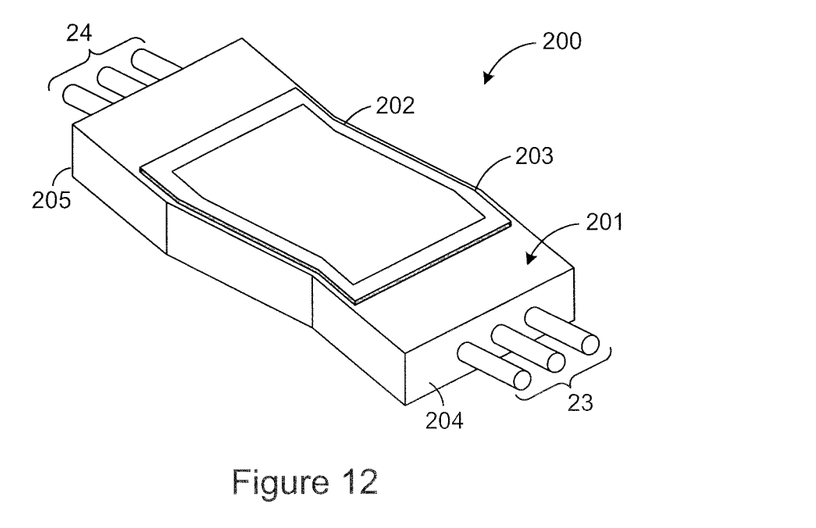
Figure 13:
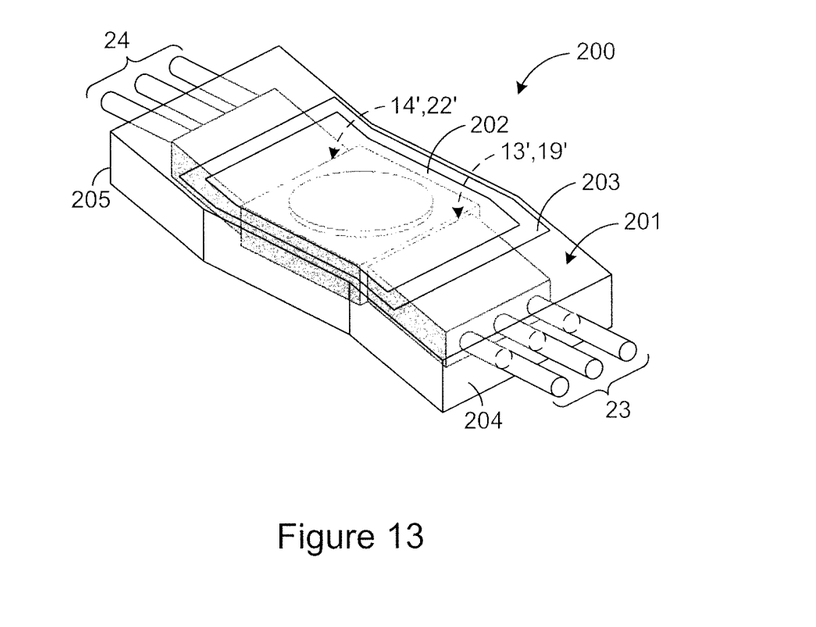

FIGS. 10-13 show various views and at various fabrication stages of a third exemplary embodiment of the photo-conductive switch of the present invention 200, with the waveguides 17' and 20' connected to the switch substrate 10 at an optimal Brewster's angle. The complete module 200 is shown in FIGS. 12 and 13, with FIG. 13 in particular illustrating the overlap of the second metal layer 202 over the waveguide-substrate interface (14', 22', and 13', 19'). An optional resistive layer 203 is also shown.

Figure 14:
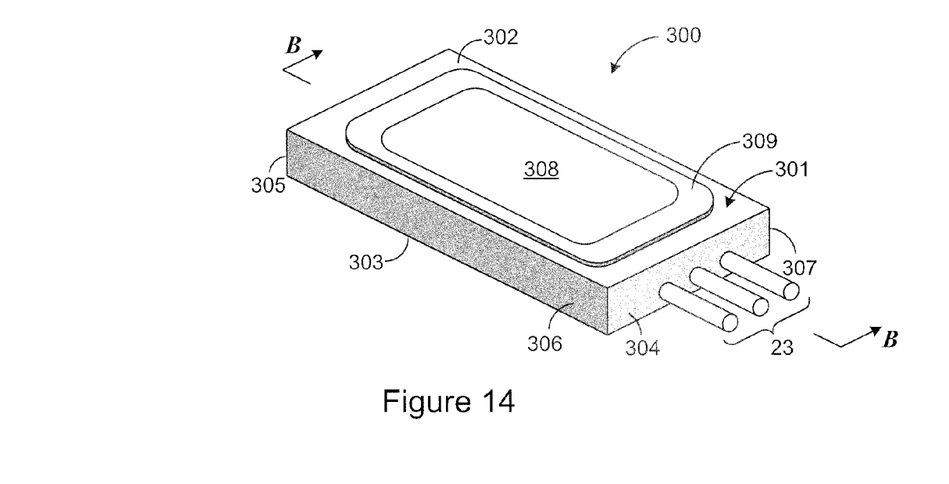
FIGS. 14 and 15 show two views of a third exemplary embodiment of the photo-conductive switch of the present invention, having a single light input surface of the wafer.
Figure 15:
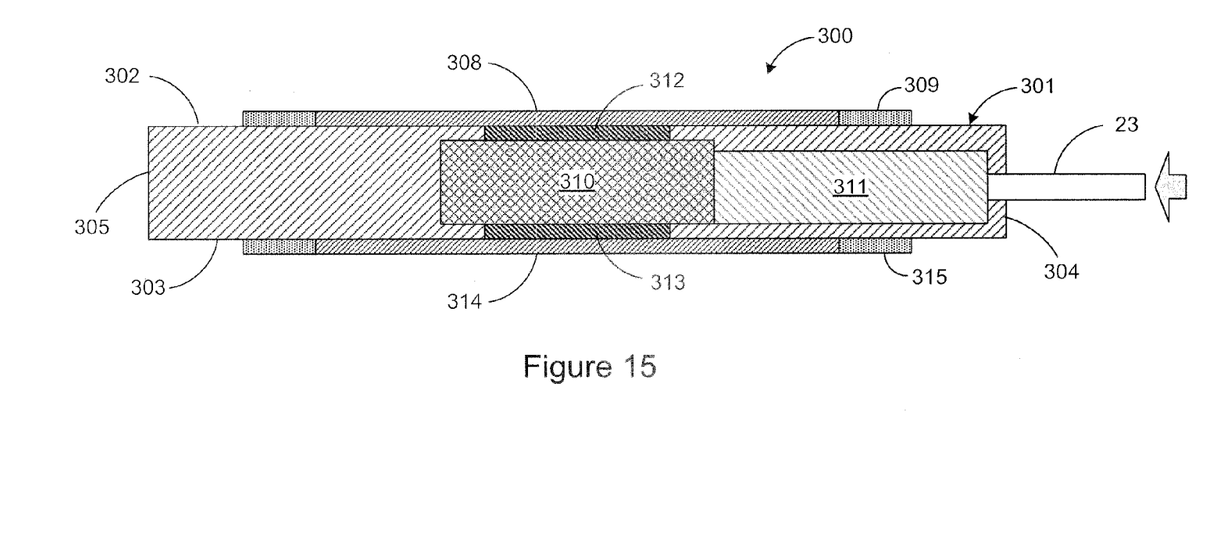
Figure 16:
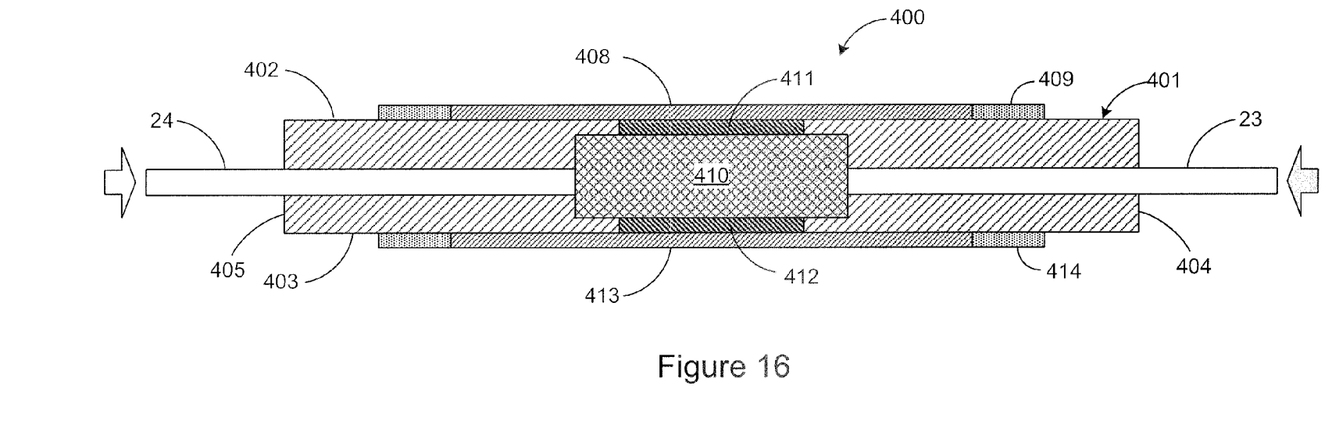
FIG. 16 shows a cross-sectional view of a fourth exemplary embodiment of the photo-conductive switch of the present invention, having fiber optics bonded directly to the substrate.
Figure 17:
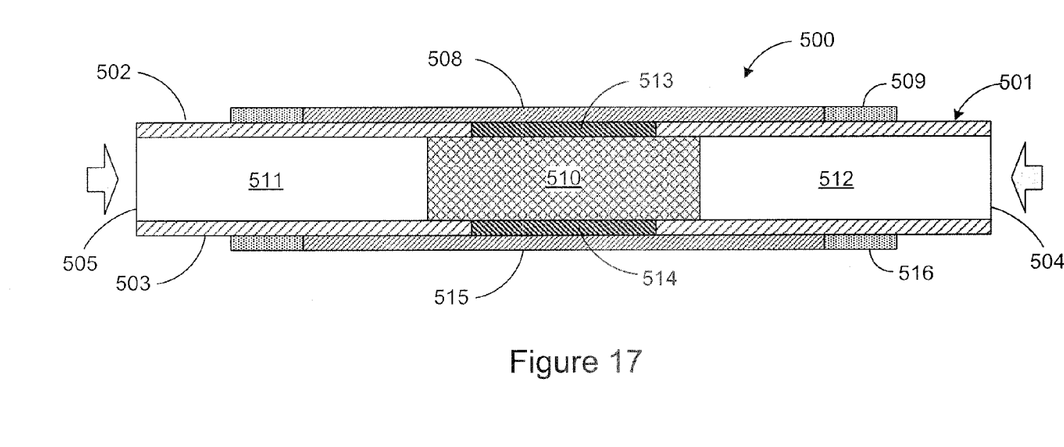
FIG. 17 shows a cross-sectional view of a fifth exemplary embodiment of the photo-conductive switch of the present invention, having two open channels formed by the encapsulation structure by which light may be directly illuminated onto the substrate.
Figure 18:
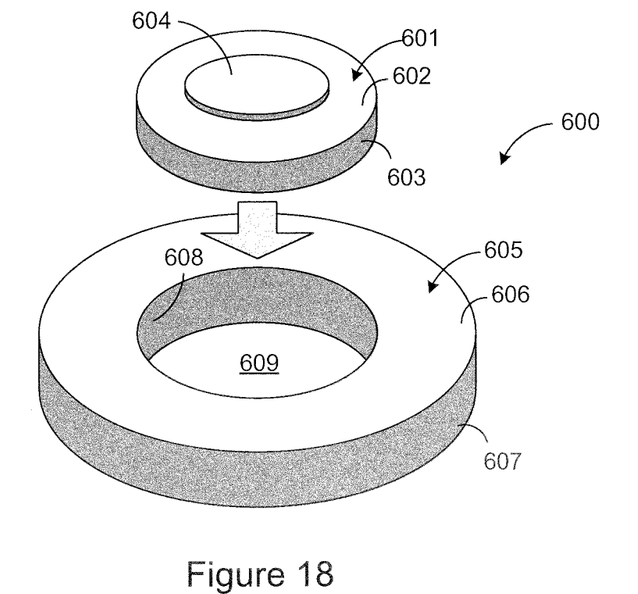
FIGS. 18-23 show various views and at various fabrication stages of a sixth exemplary embodiment of the photo-conductive switch of the present invention, with the substrate and waveguide having cylindrical and tubular configurations, respectively.

FIGS. 14 and 15 show two views of a third exemplary embodiment of the photo-conductive switch of the present invention 300, having a single light-input surface of the substrate. A single waveguide 311 is shown bonded to the substrate, with optical fiber 23 bonded to the single waveguide. FIG. 16 shows a cross-sectional view of a fourth exemplary embodiment of the photo-conductive switch of the present invention 400, having fiber optics 23 and 24 bonded directly to the substrate at opposite ends. And FIG. 17 shows a cross-sectional view of a fifth exemplary embodiment of the photo-conductive switch of the present invention 500, having two open channels 511 and 512 formed by the encapsulation structure by which light may be directly illuminated onto the substrate.

FIGS. 18-23 show various views and at various fabrication stages of a sixth exemplary embodiment of the photo-conductive switch of the present invention 600, with the substrate and waveguide having cylindrical and tubular configurations, respectively. In this example embodiment, the substrate 601 is a cylinder having a top surface 601 and tubular outer surface 603. A first metal layer 604 is shown formed and annealed on the top surface (with another on the bottom surface, though not shown). The annealed substrate is then inserted into the hole 609 of a ring-shaped waveguide 605 having a top surface 606 and tubular outer surface 607. It also has a tubular inner surface 608 which contacts and interfaces the outer surface 603 of the substrate, and together forms the waveguide-substrate interface.

Figure 19:
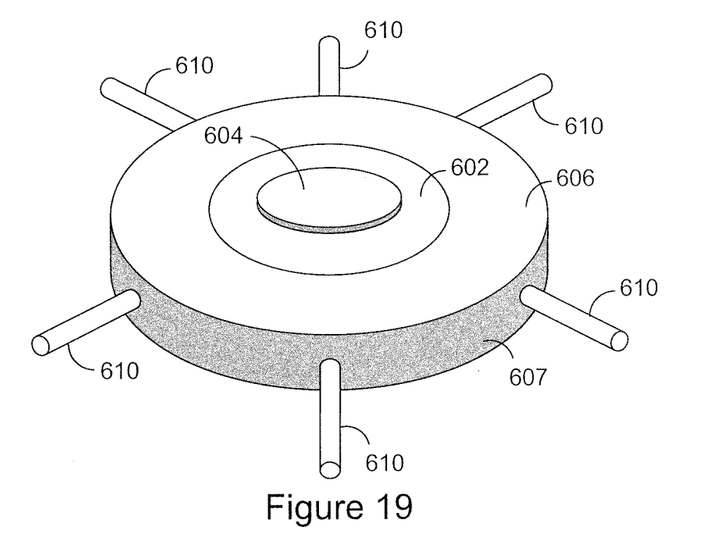
Figure 20:
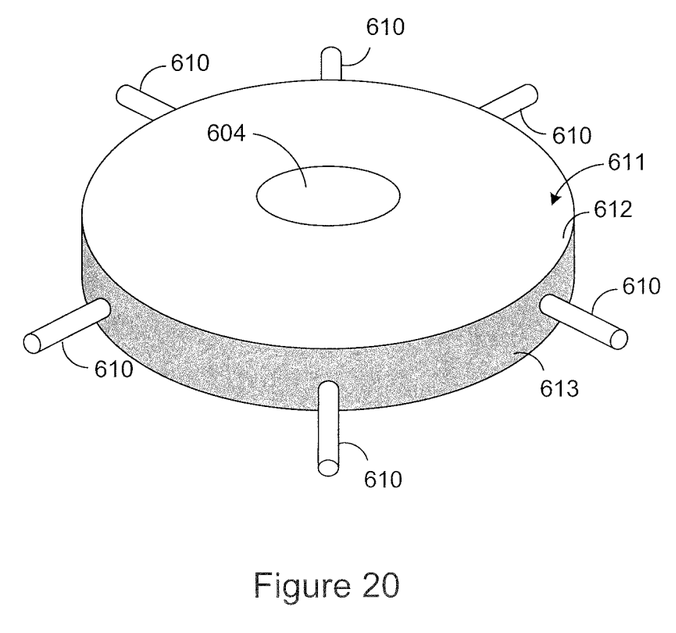
Figure 21:
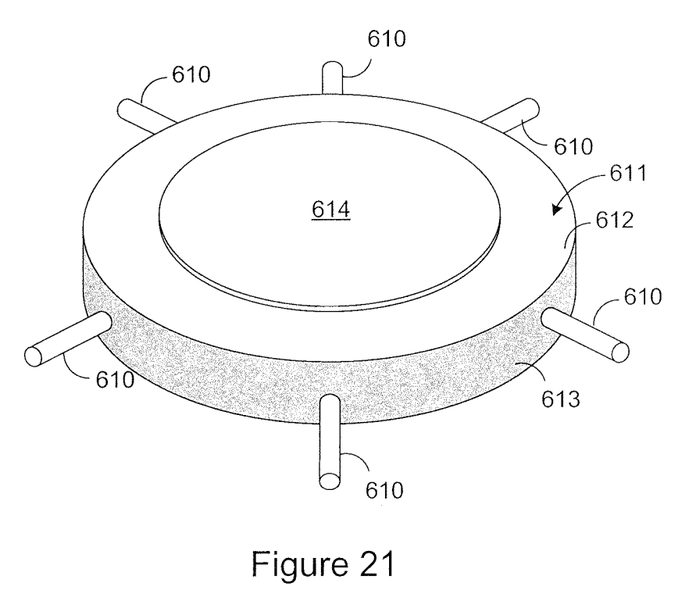
Figure 22:
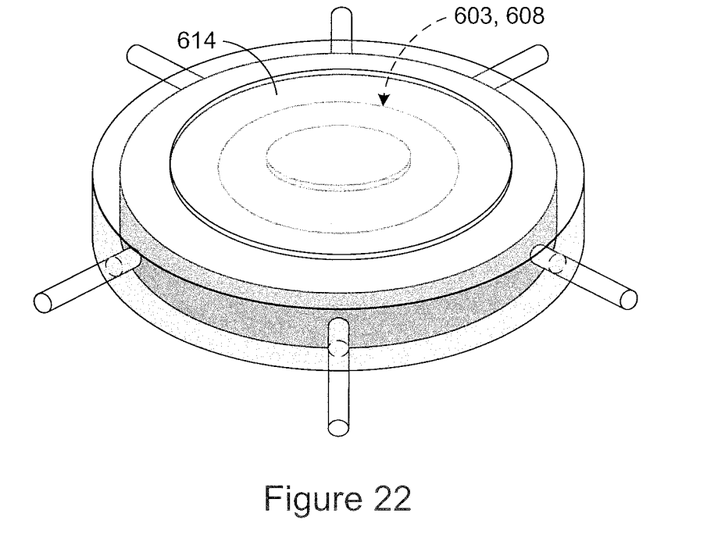
Figure 23:
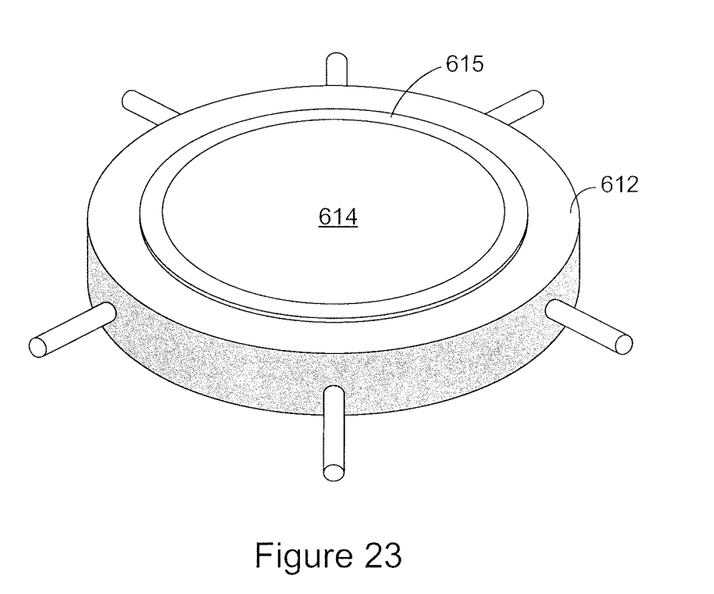

FIG. 19 shows optical fibers 610 bonded to the waveguide evenly around its perimeter. And FIG. 20 shows encapsulation structure 611 formed to surround the assembly of FIG. 18, with only the first metal layer 604 exposed, and the optical fibers 610 extending out. And FIG. 21 shows a second metal layer 614 formed, and in FIG. 23 an optional resistive layer 612 formed on the top surface 612 of the encapsulation layer to surround the second metal layer 614.

Figure 24:
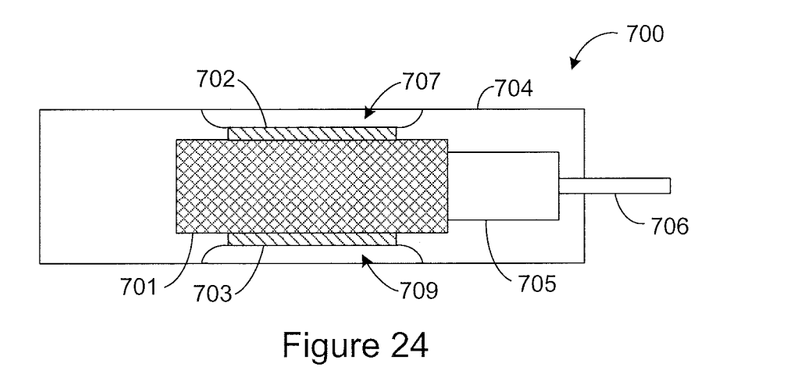
FIGS. 24-26 show cross-sectional views and at various fabrication stages of another embodiment of the photo-conductive switch package module of the present invention having a dielectric encapsulation with profiled metalized concavities (e.g. with curvilinear profiles) for receiving the convex profile of mating electrodes.

Another exemplary embodiment is shown in FIGS. 24-27 where the dielectric encapsulation (e.g. epoxy, alumina, fused silica, sapphire, etc.) has profiled and metalized concavities on opposite sides of the encapsulation. FIG. 24 in particular shows a cross-sectional view of the photo-conductive switch package of the present invention, generally indicated at reference character 700, and having a photo-conductive substrate 701 having first metal layers (702, 703) formed on opposing electrode-interface surfaces of the substrate. A waveguide 705 is also shown connected (e.g. bonded) to a light-input surface of the substrate, and an optical fiber 706 connected (e.g. bonded) to the waveguide. A dielectric encapsulation 704 is shown surrounding the photo-conductive substrate as well as the waveguide and a portion of the fiber optic. The encapsulation 704 has profiled concavities 707 and 709 on opposite sides of the encapsulation, with the profiled concavities bounded in part by the first metal layers 702 and 703, and the first metal layers 702 and 703 are exposed in the profiled concavities. By "profiled concavity" it is meant that the concavity is shaped to have a particularly contoured profile, which may be a substantially curvilinear profile, or more particularly one selected from contour profiles (e.g. edge contour profiles) known in the art, such as for example, the Rogowski, Bruce, Harrison, Chang, and Ernst profiles. The "Rogowski profile" is described in the article "The Electric Field at the Edges of Plate Condensers", by W. Rogowski, Arch. F. Elekt., Vol. 12, No. 1, (1923), incorporated by reference herein. As an example, a photo-conductive switch package of the present invention may have a Rogowski profiled and metallized encapsulation concavity for $\psi=0.6\pi$ (108 degrees). The "Bruce profile" is described in the article, "Calibration of Uniform-field Spark-gaps for High Voltage Measurements at Power Frequencies" by F. M. Bruce, Jour. IEEE Vol. 94, page 138 (1947), incorporated by reference herein. The "Harrison profile" is described in the article, "A Computer Study of Uniform-field Electrodes" by J. A. Harrison, Br. J. Appl. Phys. Vol. 18, Number 11, page 1617 (1967), incorporated by reference herein. The "Chang profile" is described in the article, "Improved Uniform-Field Electrode Profiles for TEA Laser and High-Voltage Applications" by T. Y. Chang, Rev. Sci. Instrum., Vol. 44, page 405 (1973), incorporated by reference herein. And the "Ernst profile" is described in the article, "Uniform-field Electrodes with Minimum Width" by Gerard J. Ernst, Optics Communications, Vol. 49, No. 4, pages 275-277 (1984), incorporated by reference herein.

Figure 25:
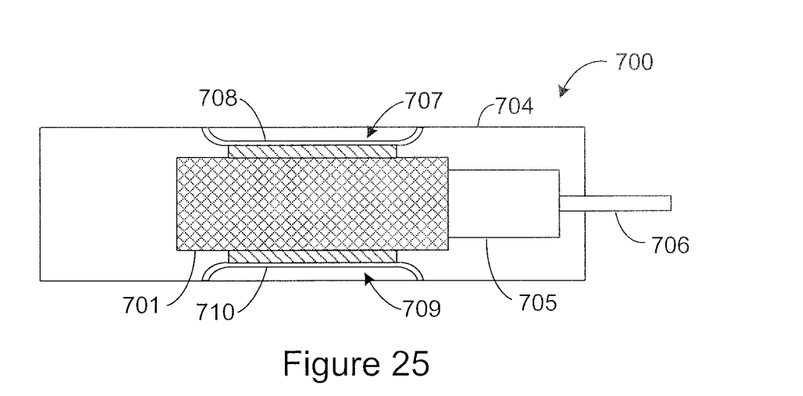

FIG. 25 shows that in the profiled concavities 707 and 709, second metal layers 708 and 710, respectively, are formed over the first metal layers 702, 703 to line the profiled concavities and form a bowl-shaped electrode region. Thus the concavities are characterized as profiled and metalized encapsulation concavities which are shaped to receive and come in contact with other electrodes having similarly profiled convex mating surfaces, such as for example electrodes 711 and 712 in FIGS. 26 and 27. In particular, the profiled concavities are used to mitigate and reduce the overall maximum (peak) electric fields occurring at enhancement points at the edges of the electrode adjacent the photo-conductive substrate (which are wide bandgap semiconductor substrates (wafers) used to fabricate high voltage photo-conductive switches, and may include compensated, semi-insulating material such as for example 4h SiC, 6h SiC, or GaN). In this manner, the maximum electric field may be designed to occur near the center of the device well away from the electrode edge, and thereby enables such switches to operate at higher average electric fields.

Figure 26:
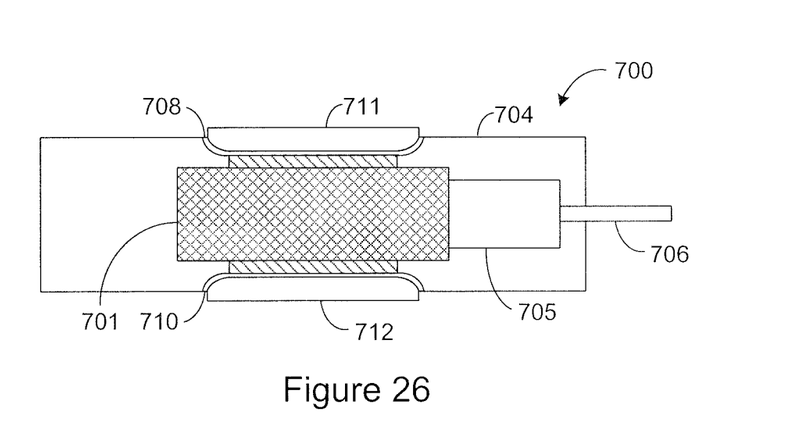
Figure 27:
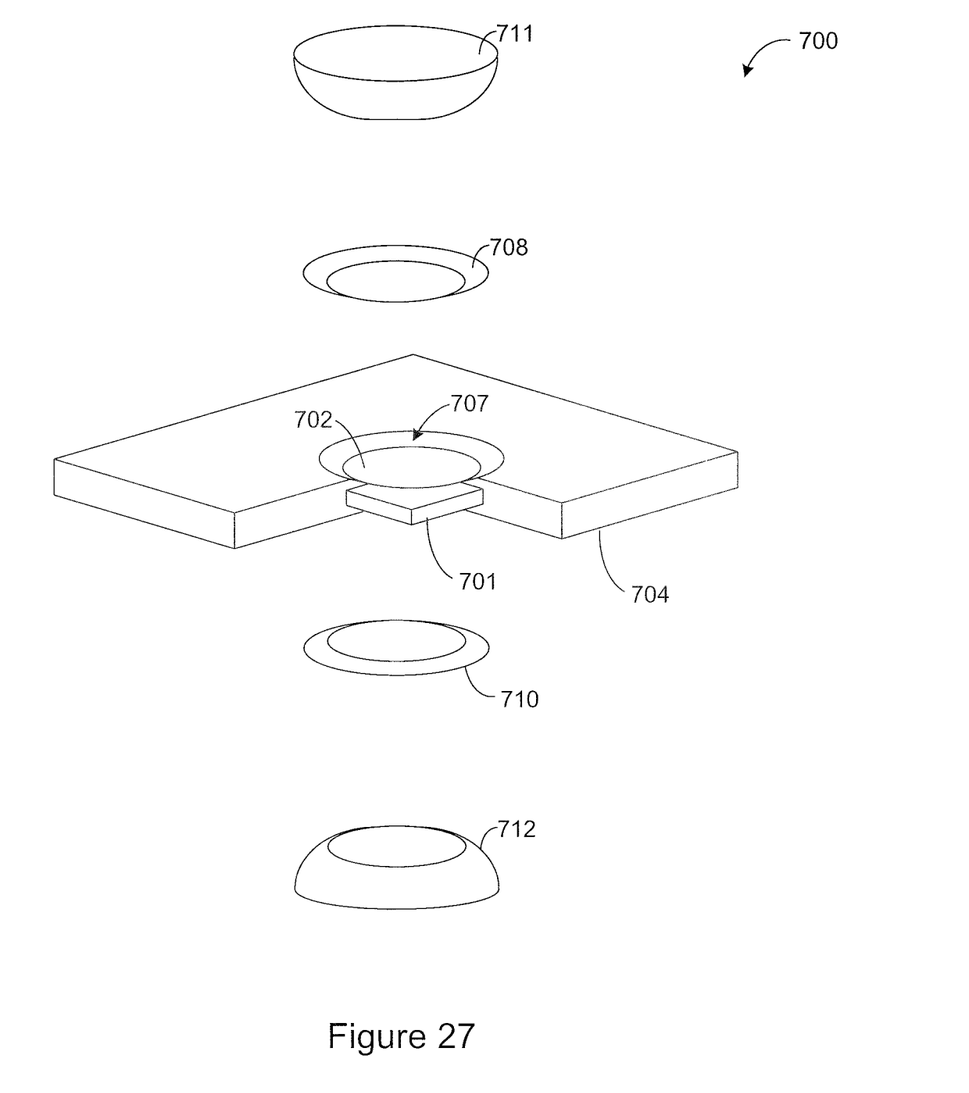
FIG. 27 shows an exploded perspective view of the photo-conductive switch package module of FIGS. 24-26, with the waveguide and optical fiber removed for clarity.

Formation of the profiled and metalized encapsulation/concavities includes first metalizing the photo-conductive substrate 701 with the first metal layers 702, 703 (one on opposite sides of the substrate). The encapsulation 704 is then formed to surround and encapsulate the substrate, and any waveguide and fiber optic connected to the substrate. It is appreciated that the waveguide may have cladding or other optical coating applied thereon to reduce losses at the interface to materials of different dielectric coefficient including the surrounding encapsulation. The first metal layers 702, 703, however, are exposed through the encapsulation 704 via the concavities 707, 709 formed in the encapsulation either at the time of encapsulation formation (e.g. casting) or in a subsequent formation step (e.g. grinding, etching, etc.). In either case, the profiled concavities are formed adjacent the first metal layers so that the first metal layers are exposed from within the concavities and contribute (together with other profiled encapsulation surfaces) to bound and define the concavities, especially the deepest extremities of the concavities. The profiled concavities of the dielectric encapsulation may be formed in various ways, such as for example, casting or otherwise mold-forming the encapsulation and the concavities around the substrate, or by grinding or otherwise machining. The profiled concavities are then metalized with the second metal layers 708, 710. As can be seen in the FIGS. 24-26, the second metal layers 708, 710 contact and line both the exposed first metal layers 702, 703, as well as the contoured/profiled encapsulation surfaces along the edge regions of the concavities. In this manner, the encapsulation concavities are both profiled and metalized, to form a bowl-shaped electrode region, as previously described. And FIGS. 26 and 27 show that separate electrodes 711, 712 may also be provided as part of the switch package, having a convex profile adapted to contactedly mate with and be received by the bowl-shaped electrode of the profiled and metalized concavities.

While particular operational sequences, materials, temperatures, parameters, and particular embodiments have been described and or illustrated, such are not intended to be limiting. Modifications and changes may become apparent to those skilled in the art, and it is intended that the invention be limited only by the scope of the appended claims.

We claim:

1. A photo-conductive switch package module comprising:
    a photo-conductive substrate having opposing electrode-interface surfaces;
    first metal layers formed on said electrode-interface surfaces;
    a dielectric encapsulation surrounding the photo-conductive substrate and having concavities on opposite sides of the encapsulation, wherein the concavities are bounded in part by the first metal layers; and
    second metal layers lining the concavities and in contact with the first metal layers.

2. The photo-conductive switch package module of claim 1,
    wherein the concavities have a substantially curvilinear profile.

3. The photo-conductive switch package module of claim 1,
    wherein the concavities have a profile selected from the group consisting of Rogowski, Bruce, Harrison, Chang, and Ernst profiles.

4. A method of fabricating a photo-conductive switch package module comprising:
    providing a photo-conductive substrate having opposing electrode-interface surfaces;
    forming first metal layers on said electrode-interface surfaces;
    encapsulating the photo-conductive substrate with a dielectric encapsulation having concavities on opposite sides thereof which expose the first metal layers from within the concavities; and
    forming second metal layers to line the concavities and come in contact with the first metal layers.

5. The method of claim 4,
    further comprising annealing the first metal layers formed on the said electrode-interface surfaces.

6. The method of claim 4,
    wherein the step of encapsulating includes mold-forming the dielectric encapsulation and the concavities.

* * * * *